(12) United States Patent
Tonezzer et al.

(10) Patent No.: US 12,337,573 B2
(45) Date of Patent: Jun. 24, 2025

(54) FILM FOR SOLAR CONCENTRATOR

(71) Applicant: POWERGLAX S.R.L., Vallelaghi (IT)

(72) Inventors: Michele Tonezzer, Altopiano della Vigolana (IT); Paolo Decarli, Vallelaghi (IT); Donato Vincenzi, Ferrara (IT); Paolo Bernardoni, Ferrara (IT)

(73) Assignee: POWERGLAX S.R.L., Vallelaghi (IT)

( * ) Notice: Subject to any disclaimer, the term of this patent is extended or adjusted under 35 U.S.C. 154(b) by 85 days.

(21) Appl. No.: 17/611,144

(22) PCT Filed: May 29, 2020

(86) PCT No.: PCT/IB2020/055108
§ 371 (c)(1),
(2) Date: Nov. 13, 2021

(87) PCT Pub. No.: WO2020/240491
PCT Pub. Date: Dec. 3, 2020

(65) Prior Publication Data
US 2022/0250356 A1     Aug. 11, 2022

(30) Foreign Application Priority Data
May 31, 2019   (IT) .......................... 102019000007722

(51) Int. Cl.
| B32B 17/10 | (2006.01) |
| B32B 7/023 | (2019.01) |
| B32B 27/08 | (2006.01) |
| B32B 27/18 | (2006.01) |
| B32B 27/30 | (2006.01) |
| H10F 77/45 | (2025.01) |

(52) U.S. Cl.
CPC .............. *B32B 17/10* (2013.01); *B32B 7/023* (2019.01); *B32B 27/08* (2013.01); *B32B 27/18* (2013.01); *B32B 27/30* (2013.01); *H10F 77/45* (2025.01); *B32B 2307/412* (2013.01); *B32B 2307/418* (2013.01); *B32B 2307/732* (2013.01); *B32B 2457/12* (2013.01)

(58) Field of Classification Search
None
See application file for complete search history.

(56) References Cited

U.S. PATENT DOCUMENTS

| 2013/0139868 A1* | 6/2013 | Zhang ................. H01L 31/0481 |
| | | 257/E31.118 |
| 2015/0168651 A1 | 6/2015 | Nishiwaki |
| 2015/0194555 A1 | 7/2015 | Zhang |

FOREIGN PATENT DOCUMENTS

| EP | 3690498 A1 | 8/2020 |
| JP | 2010053106 A | 3/2010 |
| WO | 2019065921 A1 | 9/2020 |

OTHER PUBLICATIONS

International Search Report and Written Opinion dated Sep. 25, 2020 from counterpart International Patent Application No. PCT/IB2020/055108.
Xin Wang et al: "Europium complex doped luminescent solar concentrators with extended absorption range from UV to visible region", Solar Energy, Pergamon Press. Oxford, GB, vol. 85, No. 9, Jun. 5, 2011 (Jun. 5, 2011), pp. 2179-2184, XP828263581, ISSN: 0038-092X, DOI: 10.1016/J.SOLENER.2011.06.007.
B. Rowan and B.S. Richards: Near-Infrared Emitting Lanthanide Complexes for Luminescent Solar Concentrators, EU PVSEC; Proceedings of the International Conference, held in Valencia, Spain, Sep. 1-5, 2008, WIP-Renewable Energies, D, Sep. 1, 2008 (Sep. 1, 2008), XP040528907, ISBN: 978-3-936338-24-9.
Japanese Office Action dated Feb. 7, 2024 from counterpart JP App No. 2021-571370.

* cited by examiner

*Primary Examiner* — Sheeba Ahmed
(74) *Attorney, Agent, or Firm* — SHUTTLEWORTH & INGERSOLL, PLC; Timothy J. Klima

(57) ABSTRACT

Described is a multi-layer film for solar concentrators, having a first plastic layer with chromophore additives dispersed in it and coupled on at least one of the two faces with a second transparent plastic covering layer which is thicker than the first layer.

20 Claims, 6 Drawing Sheets

FILM FOR SOLAR CONCENTRATOR

This application is the National Phase of International Application PCT/IB2020/055108 filed May 29, 2020 which designated the U.S.

This application claims priority to Italian Patent Application No. 102019000007722 filed May 31, 2019, which application is incorporated by reference herein.

TECHNICAL FIELD

This invention relates to a film designed for making luminescent solar concentrators and in particular a multilayer luminescent film for solar concentrators.

BACKGROUND ART

Luminescent solar concentrators (hereinafter referred to as LSC) are photovoltaic devices based on a sheet or a film functionalized with transparent photo-luminescent and/or coloured substances (hereinafter referred to as chromophores), which are able to capture a portion of the incident solar radiation and to re-introduce it. A portion of the radiation emitted by the chromophores remains trapped inside the film/sheet due to the phenomenon of total internal reflection.

If the solar concentrator has a sufficiently smooth air interface, the portion of fluorescence light trapped inside the sheet or film undergoes a multiple reflection process from one interface to the other and reaches the perimeter of the same. On the lateral surface of the concentrator there are photovoltaic cells which convert the fraction of luminescence radiation trapped inside the sheet/film into electrical current. This current may be advantageously used for powering external users (lighting systems, recharging systems, shading or integrated lighting systems, etc.), may be stored in storage systems or it may be introduced into the grid.

There numerous and important advantages of LSC devices compared with flat photovoltaic systems and traditional concentration photovoltaic systems (hereinafter referred to as CPV). The main advantages are as follows:
a) significant reduction in the quantity of semiconductor material used;
b) use of the direct and diffuse solar radiation components: the solar radiation is converted with the same efficiency irrespective of the position and the orientation of the panel with the consequent advantage of being able to use the LSC devices both on façades exposed directly to the sun (i.e. facing SOUTH) and on façades exposed only to the diffuse component (i.e. facing NORTH) and irrespective of the inclination of the capturing surface (i.e. horizontal, vertical and/or oblique inclination);
c) good heat dissipation due to the large area of the collector panel which is placed in contact with the outside environment. This allows the photovoltaic receivers coupled to the edges of the sheet to work under reduced temperature conditions, which gives them a high conversion efficiency (the effectiveness of commercial semiconductors in fact decreases with the increase in operating temperature).
d) absence of solar tracking systems: this feature, which makes the LSC photovoltaic panels unique compared with the conventional CPV panels, on the one hand significantly increases the architectural integration of the devices and, on the other hand, considerably reduces the cost, weight and maintenance activities;
e) possibility of identifying chromophores which allow a high degree of overlap between the emission spectrum of the chromophore itself and the spectral response curve of the photovoltaic cells. This allows the cells to operate whilst maximising the conversion efficiency and minimising their overheating and any damage.

However, the performance of LSC devices depends on various leak mechanisms: the first mechanism concerns the sunlight which does not reach the luminescent chromophore due to the reflection of a part of photons at the surface of the sheet. The second loss mechanism is attributable to the chromophore systems, and in particular to the following phenomena:
i) the chromophores are characterised by specific spectral regions with a high absorption coefficient and spectral regions inside which the luminous radiation is not absorbed and reaches the opposite face of the sheet;
ii) some of the photons absorbed are not re-emitted by the chromophores but are dissipated in the form of heat;
iii) the light re-emitted by the chromophore is refracted by the matrix inside of which the chromophores are dispersed through the so-called "escape cone" instead of being reflected internally;
iv) the re-absorption of the photons emitted by a first portion of the chromophores present inside the luminescent film, by a second portion of chromophores. This phenomenon occurs due to the possible partial overlapping of the emission and absorption bands of the luminescent substances.

The third leak mechanism is due to the transparent matrix and comprises the following potential limitations:
i) the material of the sheet is not completely transparent over the entire range of wavelengths of the light emitted by the chromophores and this generates an optical absorption and therefore a loss of performance;
ii) the imperfections in the finishing of the surface can induce the refraction outside the luminescent sheet/film, reducing the luminous intensity perceived by the photovoltaic cells.

The fourth loss mechanism is linked to the photovoltaic cells: in fact, they have a spectral response which depends on the wavelength of the incident photons and are not able to convert in an optimum manner the entire emission spectrum.

The use of chromophores having a large Stokes' shift (difference of wavelength between the peak of the absorption spectrum and that of the emission spectrum) makes it possible to drastically reduce the self-absorption of the chromophore and, therefore, the second leak mechanism. The absorption by the inert matrix can, on the other hand, be reduced using a material with a high transparency.

The most well-known and widely experimented approach for making LSC sheets consists in dispersing the chromophores in a transparent matrix of plastic material, in particular polymethyl methacrylate (PMMA) or polycarbonate (PC). Whilst the use of plastic material has the advantage of reduced weight (with respect to glass) and greater versatility and lower production costs, it is not particularly suitable for use in the building sector: the greater degree of inflammability, the emission of fumes in the case of combustion and the lower resistance to scratching constitute aspects which significantly limit the applicability of LSC systems in the architectural sector.

On the other hand, the inclusion of chromophores inside a vitreous matrix is extremely difficult since the chromophore complexes are usually characterised by a component of an organic nature and they deteriorate irreversibly at temperatures typically higher than 150-200° C., whilst the temperature for processing glass is significantly higher.

An example of a luminescent solar concentrator is described in patent document US2015194555 wherein a single layer film, functionalized with chromophores, is inserted between two sheets of glass or plastic material.

The confining of the fluorescence radiation is facilitated thanks to the difference in refraction index between the outer surface of the outer sheets and the air.

Aim of the Invention

The aim of this invention is to provide a film for luminescent solar concentrators which is easy and inexpensive to make, which can also be used in the building sector without the above-mentioned drawbacks.

Said aim is fully achieved by the film for luminescent solar concentrators according to the invention as characterised in the appended claims.

BRIEF DESCRIPTION OF THE DRAWINGS

The invention will now be described by way of a non-limiting example with reference to the accompanying drawings in which.

DETAILED DESCRIPTION OF PREFERRED EMBODIMENTS OF THE INVENTION

Figure 3:
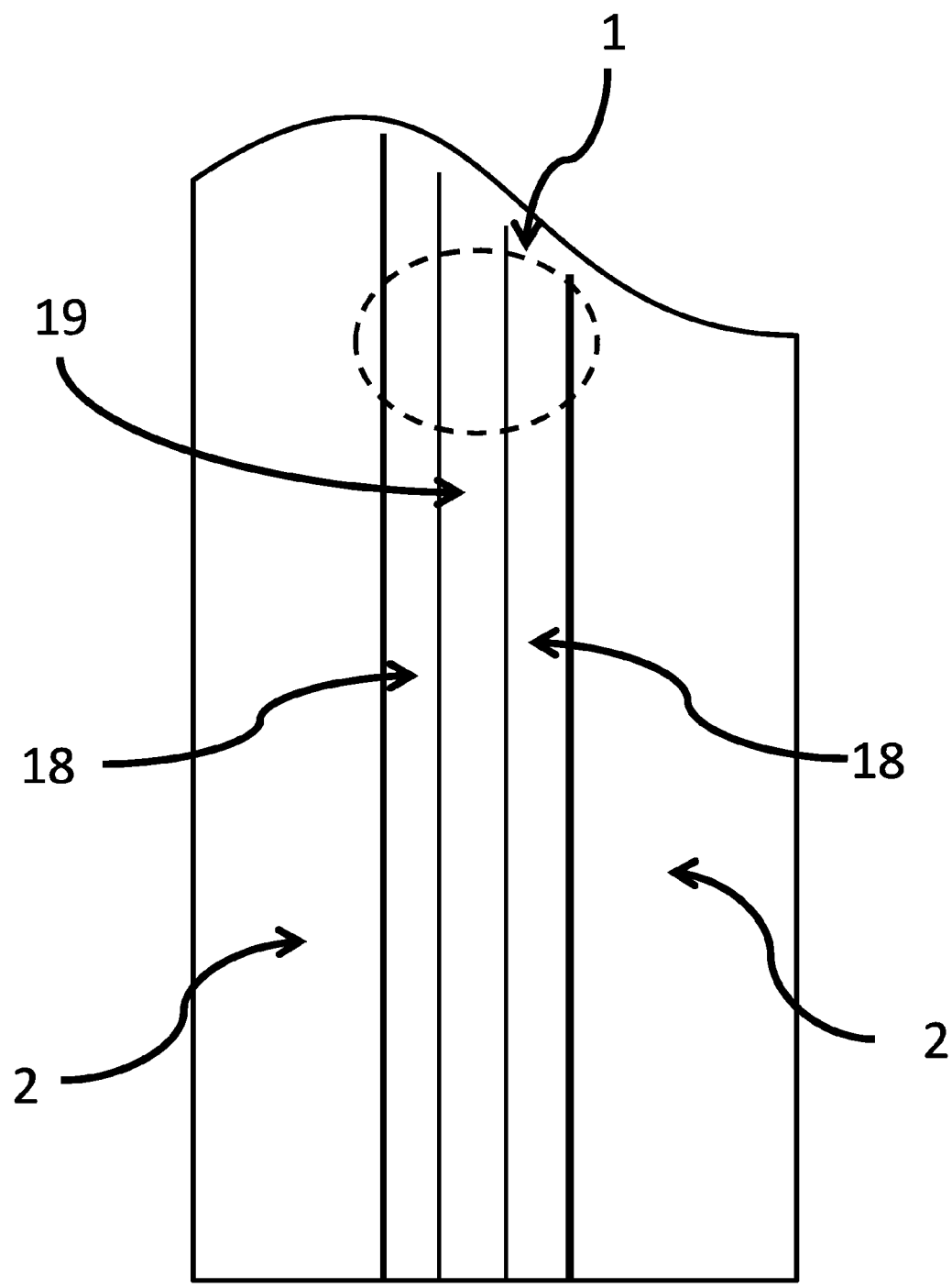
FIG. 3 illustrates a multi-layer film, made according to the invention and used in the luminescent solar concentrator (LSC) of FIG. 2.

With reference to FIG. 3, the reference numeral 1 denotes in its entirety a plastic film designed for making luminescent solar concentrators.

The film 1 comprises a first plastic layer (film) 19, mixed with chromophores dispersed therein and which, in the example illustrated, is covered on both sides or faces by respective transparent second layers (film) 18 which are thicker than the first layer 19.

The film 1 according to the invention is a multi-layer film to which reference is made below, preferably designed, as described in more detail below, for making a layered glass.

The first layer 19 has a thickness of between 1 um and 150 um.

Each second layer 18 has a thickness of between 160 um and 3200 um. Preferably, each second layer 18 has a thickness substantially less than 1600 um, in such a way that the overall thickness of the multilayer film 1 is substantially less than 3200 um.

Preferably, the two second layers 18 have the same thickness.

The first layer 19 is made preferably of PVB (Polyvinyl butyral).

The second layers 18 are also made preferably of PVB (Polyvinyl butyral).

Advantageously, the layers 18 and 19 are made of the same material and the presence of the chromophores in the first layer modifies the refraction index of the material promoting the confinement by total internal reflection.

In a variant embodiment not illustrated, the first layer 19 is coupled on only one of the two faces with a respective second transparent plastic covering layer 18. In that case, it is preferable that the second layer 18 has a thickness substantially less than 3600 um.

In a further variant embodiment not illustrated, the film 1 may comprise a number n of layers greater than three, with an optically active intermediate layer (layer 19), again with a thickness of between 1 and 150 um.

In all the cases described above (i.e.: structure with three or more layers, symmetrical or not, or two-layer or multi-layer structure), the total thickness of the film 1 is such as to be able to include the latter as an intermediate layer in layered glass, in particular which can be used in building works, for example for making windows or covering panels.

As illustrated in FIGS. 2 to 5, the film 1 can therefore be interposed in the form of thin film between two sheets of glass 2 for optimising the coupling so as to increase the structural strength and prevent the dispersion of fragments of glass in the case of breakage. At the same time, the layered glass provided with the film 1 according to the invention may then be associated with an LSC device of known type, comprising a set of bypass diodes 4 (optional), electrical connectors 5 and photovoltaic cells 6.

In fact, the film 1 is a luminescent plastic film characterised by the presence of chromophores which are able to absorb a portion of the solar radiation and insert it isotropically.

The process leading to layered glass is a lamination process which may occur using heated rollers or in an autoclave at temperatures of between 120° C. and 150° C., compatible with the non-degradation of the chromophore systems.

The PVB with which the layers 18 (or the single layer 18) are made is cut from a roll, whilst the one with which the layer 19 is made comes from a specific process described below.

Firstly, it should be noted that the intrinsic physical-chemical properties of PVB do not allow the melting of this material in order to incorporate the chromophores inside it. It is therefore necessary to use a technique comprising the following steps: dissolving the PVB in solvent, mixing with the chromophore powder and the subsequent re-depositing of the PVB added by evaporation of the solvent.

According to a first embodiment, the first layer 19 comprises one or more types or classes of chromophores based on luminescent organic compounds, selected preferably from perylene chromophores, naphthalene derivatives (2-(2-ethylhexyl)-6.7-dimetossi-1Hbenzo[de]isochinolin-1.3 (2H)-dione), rhodamine compounds (C28H31ClN2O3), 3-Hydroxyflavone, 4-dicyanomethyl-6-dimethylaminostiryl-4H-pyran (DCM)).

In this case, as explained below, the first layer 19 comprises chromophores based on luminescent organic compounds with a concentration of chromophore greater than 1.0 mg/cm3.

According to a second embodiment, the first layer 19 comprises one or more types or classes of chromophores based on lanthanoid compounds, selected preferably from chromophores based on compounds of europium (Eu), yttrium (Y), lanthanum (La), gadolinium (Gd), erbium (Er) and terbium (Tb), neodymium (Nd), ytterbium (Yb).

In this case, as explained below, the first layer 19 comprises chromophores based on lanthanoid compounds with a concentration of chromophore greater than 2.0 mg/cm3.

According to a third embodiment, the first layer 19 comprises one or more types or classes of chromophores based on luminescent crystals and/or nano-crystals, selected preferably between silicon (Si), cadmium selenide (CdSe), lead sulphide (PbS), lead selenide (PbSe), zinc selenide (ZnSe), copper indium sulphide (CuInS2), composite systems CdSe/CdS, composite systems PbS/CdS, copper-based composite systems (Cu) and CdSe, manganese-based composite systems (Mn) and ZnSe.

In this case, as explained below, the first layer 19 comprises chromophores based on luminescent crystals and/or nano-crystals with a concentration of chromophore greater than 0.4 mg/cm3.

With reference to the above, it has in effect been found experimentally that the production of the thin film layer 19 with a density of chromophores greater than a threshold depending on the type of molecule used results in a significant variation of the refraction index of the material.

Figure 6:
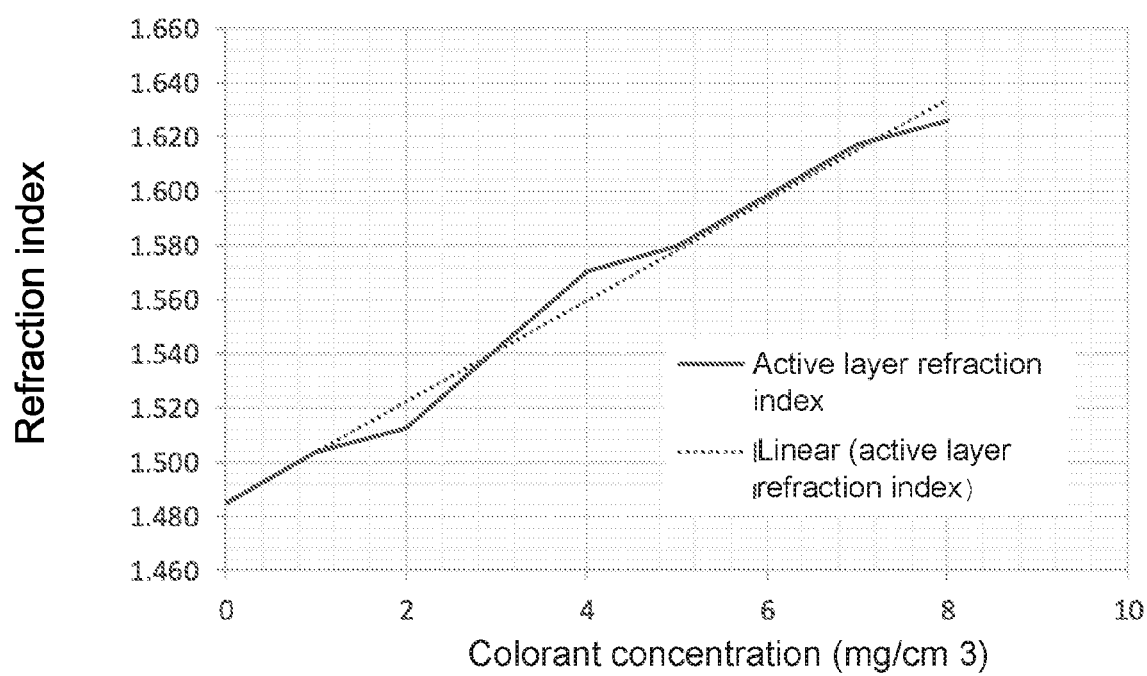
FIG. 6 shows a graph of the increase in the refraction index measured in samples of PVB (Polyvinyl butyral) mixed with chromophores based on compounds of perylene.

FIG. 6 shows the increase in the refraction index measured in samples of PVB mixed with chromophores based on compounds of perylene. A similar behaviour has also been found for chromophores based on naphthalene complexes, lanthanoid complexes and colloidal crystalline complexes.

As a result of this increase in the refraction index, the luminous radiation which is re-emitted by the chromophores remains mainly confined inside the first layer 19 undergoing total reflection inside the interface with the transparent layers 18.

In practice, the first plastic layer 19 has a first refraction index and the second non-mixed layer 18 has a second refraction index less than the first refraction index to promote the confinement by total internal reflection of the luminous radiation inside the first layer 19.

Advantageously, the total internal reflection occurs mainly inside the layer 19 mixed with chromophores, due to the increase in the refraction index promoted by the presence of the chromophores themselves relative to the layers 18.

This effect, which is common to all the chromophores described above, is significant only above a predetermined concentration of chromophore.

The "threshold" concentration varies according to the class of chromophores used:
i. in the case of organic chromophores a threshold concentration of chromophores of 1.1 mg/cm3 is found;
ii. in the case of lanthanoid-based chromophores a threshold concentration of chromophores of 2.1 mg/cm3 is found;
iii. in the case of chromophores based on colloidal nano-crystals a threshold concentration of 0.5 mg/cm3 is found.

According to a further embodiment, the first layer 19 may comprise chromophores of one or more of the types or classes described above, co-existing together with the respective concentrations mentioned above.

According to any one of the above-mentioned techniques, the first layer 19 is made, as mentioned above, from a solution of PVB (Polyvinyl butyral) dissolved and mixed with chromophores based on organic complexes and/or complexes based on lanthanoid systems and/or complexes based on inorganic crystals/nano-crystals. The mixture is deposited by airbrushing or by roll-printing on an inert substrate to form the first layer 19, which is then detached from the inert substrate after it has dried.

The layer 19 is then coupled to one or more second layers 18 by roller lamination.

Alternatively, the mixture described above is deposited by airbrushing or by roll-printing directly on a second layer 18.

In the latter case, the set of layers 18 and 19 may, if necessary, be coupled after at least one further layer 18 by roller lamination.

The technique of depositing by means of airbrushing has the advantage of allowing the depositing of large surfaces by means of automated apparatuses which are widely designed and industrialised. Another aspect linked to this depositing technique is that of facilitating the evaporation of the solvent due to the high surface/volume ratio. In fact, layers with a greater thickness require significantly longer times to obtain a solidification of the film due to the slower process of diffusion towards the surface of the solvent and subsequent evaporation.

The thickness of the layer (film) obtained with this depositing technique is, however, extremely reduced and is generally less than 10 um, irrespective of the quantity of solvent used. After depositing, the film created does not have a thickness such that it can be easily handled and requires an inert and transparent support substrate. Moreover, the extremely reduced thickness of the film which it is possible to make with this technique makes it not very suitable for being used by itself as an encapsulating material for layered glass. For this reason, as described above, the layer 19 thus obtained is coupled to one or more layers 18 (or formed directly on a layer 18).

The roll-printing depositing technique allows layers (film) to be made with a thickness generally greater than 10 um with a reduced solvent content. The thickness of the films made by roll-printing is less than 150 um, generally less than 100 um.

Also in this case, the thickness of the film is not such that it can be used directly for the lamination of layered glass. In this case, too, as described above, the layer 19 thus obtained is coupled to one or more layers 18 (or formed directly on a layer 18).

The techniques described for making the first layer 19 (active film) and the adhesion (or the formation) of the latter on at least a second transparent layer 18 with a greater thickness allow a multi-layer film 1 to be made with a total thickness suitable for being used directly as film for making layered glass.

In other words, the invention described is based on the use of a plastic matrix multilayer wherein only one layer (first layer 19) is mixed with chromophores, whilst at least one other layer (second layer 18) is optimised to guarantee the structural, transparency and adhesion properties for the glass. This solution allows the production of luminescent solar devices with exposed glass surfaces, which use a wide range of chromophore systems suitably dispersed in plastic matrix as active material.

One of the advantages deriving from the invention is that it improves the efficiency of transmitting the luminous radiation 11 (FIG. 4) thanks to a more effective confining of the radiation in the first thin layer 19.

Advantageously, therefore, the light 11 re-emitted by the chromophores and mainly confined inside the first thin layer 19 is transmitted in a decidedly better manner than if the luminous radiation 10 is transmitted inside the entire thickness of the layered glass. The outer surfaces of the sheets of glass 2 may in effect be soiled or covered by a thin layer of powder and thus adversely affect the correct transmission of the fluorescence radiation 10. On the other hand, according to the invention, the luminous radiation 11 remains confined inside the first layer 19, whose separation interfaces are always clear, clean and protected from dust or soiling. The edge of the multilayer film 1, and in particular of the first layer 19, can therefore convey the luminous radiation in an optimum and efficient manner towards the photovoltaic cells 6 of the LSC device.

Figure 1:
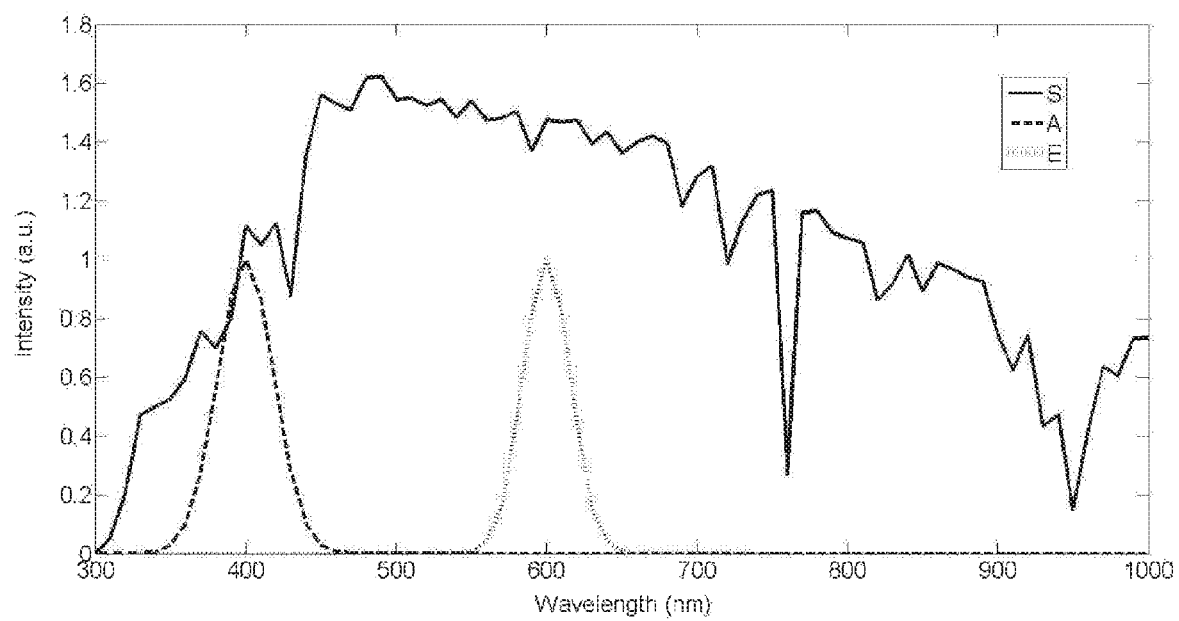
FIG. 1 shows a graph of the spectral power density of the solar source (S) compared with the absorption spectrum (A) and the emission spectrum (E) of a chromophore used in luminescent solar concentrators (LSC)
Figure 2:
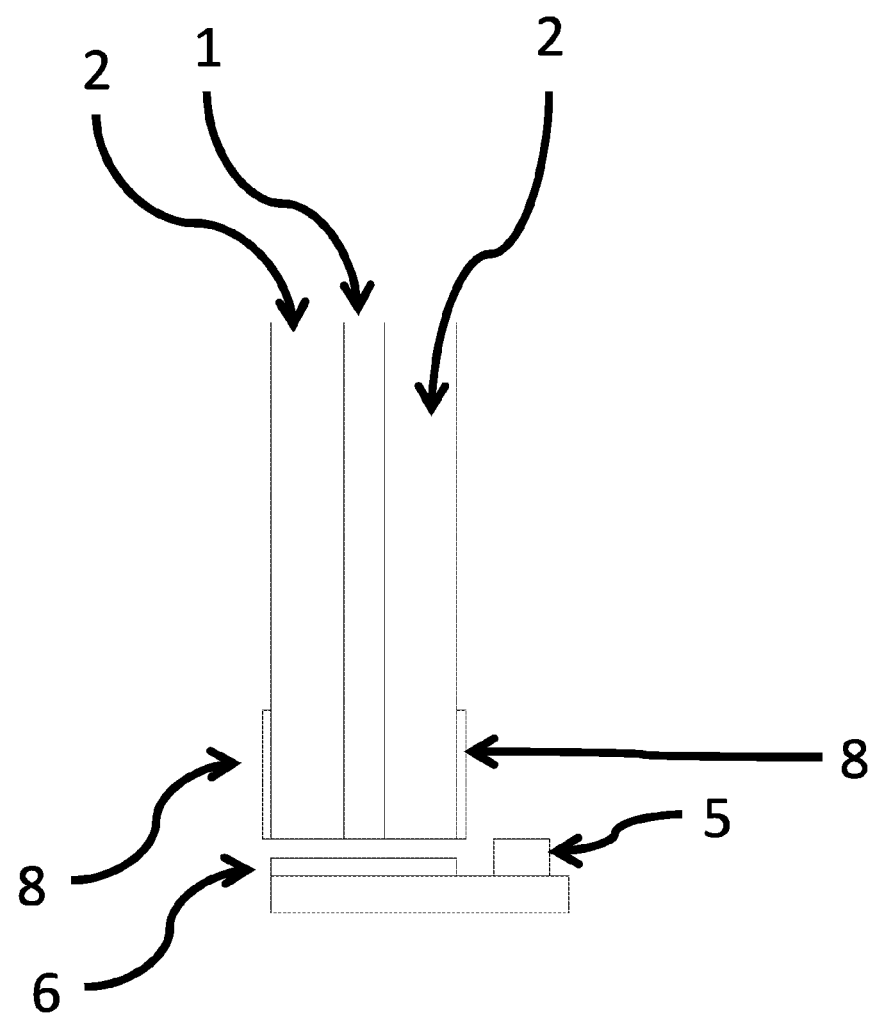
FIG. 2 illustrates a luminescent solar concentrator (LSC) made according to the invention.
Figure 4:
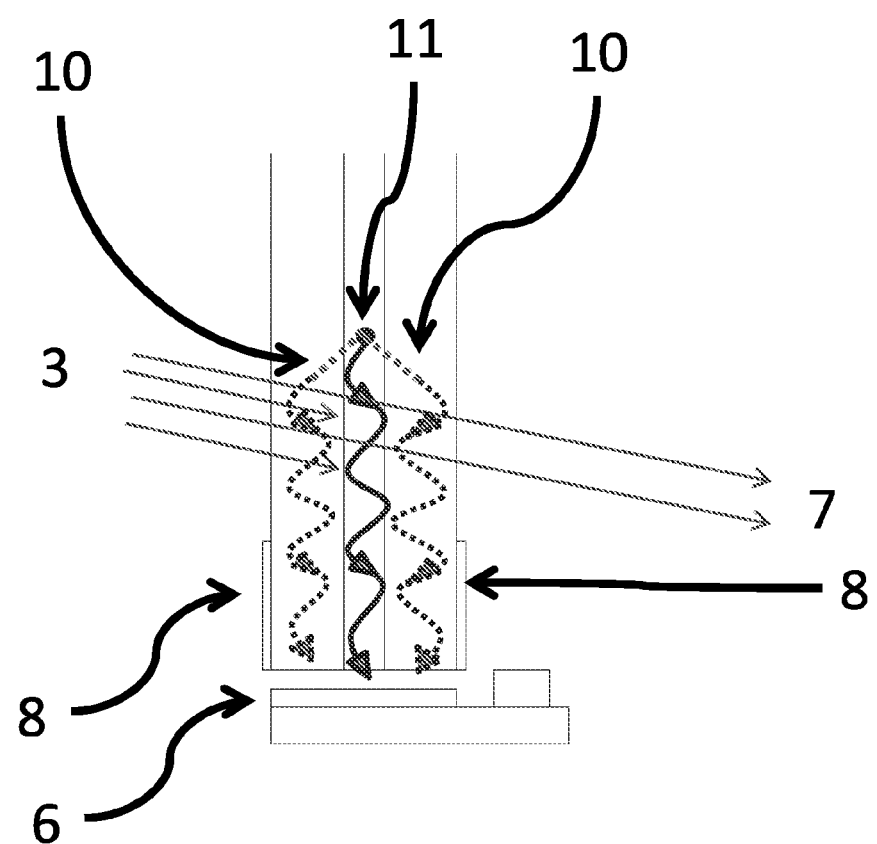
FIG. 4 schematically illustrates, with reference to FIG. 2, the optical path of the rays emitted by a colour centre.
Figure 5:
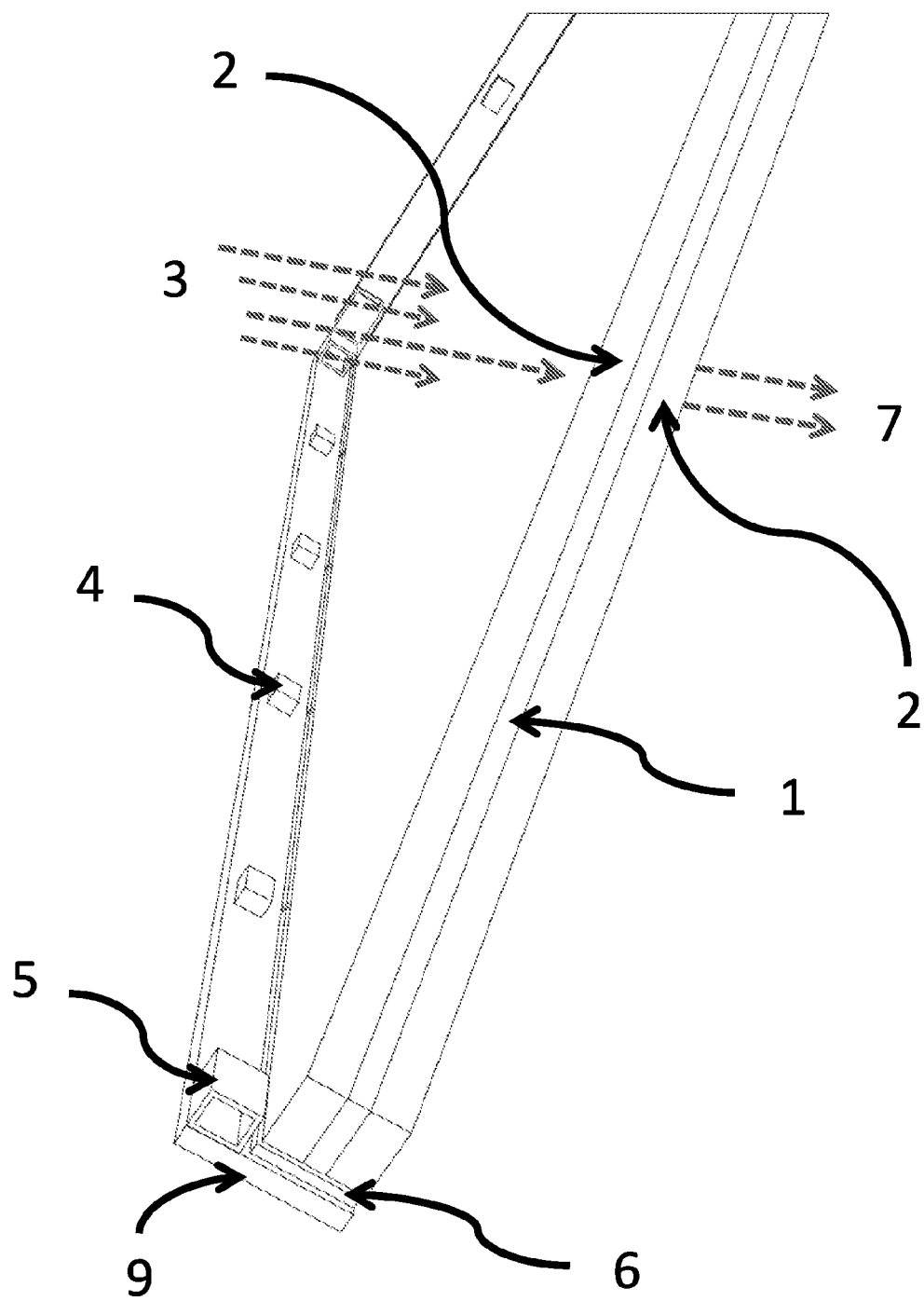
FIG. 5 is a perspective view of the luminescent solar concentrator (LSC) of FIG. 2.

More in detail, FIGS. 2, 4 and 5 show the multilayer film 1, containing inside it a region rich in chromophores, incorporated between the two sheets of glass 2. The multilayer film 1 performs the function of encapsulating as well as that of an optically active material for the purposes of luminescence. The above-mentioned photovoltaic cells 6 are positioned on the perimeter in the form of an array in order to convert the luminous radiation into electricity.

The perimeter portion of the glass sheets 2 is advantageously covered by reflective strips 8 which are designed to prevent any elements for fixing the sheet from reducing the efficiency of transmitting the luminous radiation towards the photovoltaic cells 6. The above-mentioned bypass diodes 4 and the above-mentioned electrical connectors 5 are mounted on a printed circuit 9, on which are housed the photovoltaic cells 6.

The incident solar radiation 3 penetrates inside the multilayer film 1 and is partly absorbed. The portion 7 complementing the radiation absorbed by the chromophores is transmitted. The multilayer film 1 transmits inside the first layer 19 a significant fraction 11 of the fluorescence radiation. Thanks to the greater confining effect introduced by the first layer 19 with a high refraction index, the fraction of luminous radiation 10 confined inside the sheets of glass 2 has an intensity considerably less than the fraction of luminous radiation 11. This phenomenon makes it possible to illuminate the photovoltaic cells 6 in their central region, far from any recombination centres present in the peripheral regions of the cells 6.

The invention claimed is:

1. A film, comprising:
   the film being configured for positioning in a luminescent solar concentrator;
   a plastic first layer, made of PVB (Polyvinyl butyral), with chromophore additives dispersed in the first layer, the first layer having a first refraction index and including an expansive light receiving face surface and a perimeter edge surface oriented at a non-parallel angle to the light receiving face surface, the perimeter edge surface having a smaller area than the light receiving face surface;
   a transparent plastic second layer coupled to of said first layer in a directly engaging manner, the second layer made of PVB without additives, and having a second refraction index less than said first refraction index and a thickness greater than the first layer;
   said second layer being coupled to the light receiving face surface in a directly engaging manner to increase total internal reflection of a luminous radiation inside said first layer, said first layer having the first refraction index increased by the presence of the chromophore additives;
   the perimeter edge surface being configured to transmit light to a photovoltaic cell positioned adjacent the perimeter edge surface;
   wherein the first layer and the second layer are both free of photovoltaic cells.

2. The film according to claim 1, wherein the first layer has a thickness of between 1 um and 150 um.

3. The film according to claim 1, wherein the second layer has a thickness of between 160 um and 3200 um.

4. The film according to claim 1, wherein the first layer is coated both on said first face and on said second face by a respective one of said second layer.

5. The film according to claim 4, wherein the two second layers have a same thickness.

6. The film according to claim 1, wherein the first layer comprises one or more types of chromophores based on luminescent organic compounds, selected from a group including perylene chromophores, or naphthalene derivatives (2-(2-ethylhexyl)-6.7-dimetossi-1 Hbenzo[de]isochinolin-1.3(2H)-dione), or rhodamine compounds (C28H31ClN2O3), or 3-Hydroxyflavone, or 4-dicyanomethyl-6-dimethylaminostiryl-4H-pyran (DCM)).

7. The film according to claim 6, wherein the first layer comprises chromophores based on luminescent organic compounds with a concentration of chromophore greater than 1.0 mg/cm3.

8. The film according to claim 1, wherein the first layer comprises one or more types of chromophores based on lanthanoid compounds, selected from a group of chromophores based on compounds of europium (Eu), or yttrium (Y), or lanthanum (La), or gadolinium (Gd), or erbium (Er), or terbium (Tb), or neodymium (Nd), or ytterbium (Yb).

9. The film according to claim 8, wherein the first layer comprises chromophores based on lanthanoid compounds with a concentration of chromophore greater than 2.0 mg/cm3.

10. The film according to claim 1, wherein the first layer comprises one or more types of chromophores based on luminescent crystals and/or nano-crystals, selected from a group including silicon (Si), or cadmium selenide (CdSe), or lead sulphide (PbS), or lead selenide (PbSe), or zinc selenide (ZnSe), or copper indium sulphide (CuInS2), or composite systems CdSe/CdS, or composite systems PbS/CdS, or copper-based composite systems (Cu) and CdSe, or manganese-based composite systems (Mn) or ZnSe.

11. The film according to claim 10, wherein the first layer comprises chromophores based on luminescent crystals and/or nano-crystals with a concentration of chromophore greater than 0.4 mg/cm3.

12. The film according to claim 1, wherein said first and second layers are coupled to each other by roller lamination.

13. The film according to claim 1, wherein the first layer is made from a mixture comprising a solution of dissolved PVB and chromophores based on organic compounds and/or compounds based on lanthanoid systems and/or compounds based on inorganic crystals/nano-crystals, and wherein said mixture is deposited by airbrushing or roll-printing on an inert substrate forming said first layer, which is subsequently detached from the inert substrate after drying.

14. The film according to claim 1, wherein the first layer is made from a mixture comprising a solution of dissolved PVB and chromophores based on organic compounds and/or compounds based on lanthanoid systems and/or compounds based on inorganic crystals/nano-crystals, and wherein said mixture is deposited by airbrushing or roll-printing directly on said second layer.

15. A luminescent solar concentrator, comprising:
    the film according to claim 1;
    at least one photovoltaic cell positioned adjacent to and facing the perimeter edge surface of the film for receiving light from the first layerfilm.

16. The luminescent solar concentrator according to claim 15, wherein the at least one photovoltaic cell includes an array of photovoltaic cells positioned around the perimeter edge surface.

17. The luminescent solar concentrator according to claim 16, and further comprising at least one printed circuit mounting the array of photovoltaic cells.

18. The luminescent solar concentrator according to claim 15, and further comprising reflective strips attached to the film adjacent the perimeter edge surface and configured to reflect light toward the at least one photovoltaic cell.

19. The luminescent solar concentrator according to claim 15, and further comprising at least one transparent protective sheet positioned adjacent one side of the film.

20. The luminescent solar concentrator according to claim 15, and further comprising transparent protective sheets respectively positioned adjacent opposite sides of the film such that the film is interposed between the transparent protective sheets.

* * * * *